United States Patent [19]

Yamawaki

[11] Patent Number: 5,019,884
[45] Date of Patent: May 28, 1991

[54] CHARGE TRANSFER DEVICE

[75] Inventor: Masao Yamawaki, Itami, Japan

[73] Assignee: Mitsubishi Denki Kabushiki Kaisha, Japan

[21] Appl. No.: 479,271

[22] Filed: Feb. 13, 1990

[30] Foreign Application Priority Data

Apr. 7, 1989 [JP] Japan .................................. 1-88294

[51] Int. Cl.⁵ ...................... H01L 29/78; H01L 27/02
[52] U.S. Cl. .......................................... 357/24; 377/57;
377/60; 377/61; 377/62; 377/63; 358/213.11;
358/213.23
[58] Field of Search ................... 357/24, 24 LR, 24 M;
377/57, 60, 61, 62, 63; 358/213.11, 213.23

[56] References Cited

U.S. PATENT DOCUMENTS

| 4,097,885 | 6/1978 | Walsh | 357/24 |
| 4,230,954 | 10/1980 | Heller | 357/24 |
| 4,686,759 | 8/1987 | Pals et al. | 357/24 |

FOREIGN PATENT DOCUMENTS

| 52-75190 | 6/1977 | Japan | 357/24 |
| 55-86157 | 6/1980 | Japan | 357/24 |
| 56-87379 | 7/1981 | Japan | 357/24 L |
| 63-36562 | 2/1988 | Japan | 357/24 L |
| 2009503 | 6/1979 | United Kingdom | 357/24 |
| 2164205 | 3/1986 | United Kingdom | 357/24 |

OTHER PUBLICATIONS

MG Expositions Group, "Electronic Imaging '88", Oct. 1988, pp. 647–656.

Primary Examiner—Andrew J. James
Assistant Examiner—Ngan Van Ngo
Attorney, Agent, or Firm—Leydig, Voit & Mayer

[57] ABSTRACT

In a charge transfer device including spaced apart channels on a semiconductor substrate, first electrodes are disposed in gaps between the channels, second electrodes are disposed opposite alternate channels overlapping the adjacent first electrodes, and a third continuous electrode overlies the alternating channels and first and second electrodes in the charge transfer direction. A first clock phase is obtained by connecting alternate first electrodes with the adjacent second electrode in the direction of charge transfer, and a second clock phase is obtained by connecting the remaining first electrodes with the third electrode. The portion of the first electrode overlapped by the second electrode in the second clock phase is larger than that in the first clock phase for stable driving by first and second clock signals out of phase by 180° and generated by a driver including a resonance circuit.

5 Claims, 4 Drawing Sheets

CHARGE TRANSFER DIRECTION 5,019,884

CHARGE TRANSFER DEVICE

FIELD OF THE INVENTION

The present invention relates to a charge transfer device and, more particularly, to a two-phase charge transfer device having a resonant circuit as a driving circuit.

BACKGROUND OF THE INVENTION

FIG. 2 shows a cross-sectional view of a prior art two-phase charge transfer device (hereinafter referred to as a CCD) in the charge transfer direction. In FIG. 2, reference numeral 5 designates a p-type substrate. An $n^-$-type layer 3 in which buried channels are formed is disposed on the substrate 5. P-type impurity channels 4 are disposed in the $n^-$-type layer 3 to determine the transfer direction of a two-phase CCD. Respective first polycrystalline silicon electrodes 1 are disposed between corresponding channels opposite $n^-$-type layer 3. Second polycrystalline silicon electrodes 2 are disposed opposite the channels 4 and partly opposite the first polycrystalline silicon electrodes 1. An intervening film 6, e.g., a thermal oxide film, is disposed on the first polycrystalline silicon electrodes 1 and is produced when a second layer gate oxide film is produced. Generally, the first and second electrodes are alternatingly driven as gates $\phi 1$ and $\phi 2$, enabling transfer of signal charges in the direction shown in FIG. 2.

Recently, integrated solid-state imaging device technology has been advancing, and a CCD having more than 10,000 stages is needed. The method of driving such a CCD has been a problem.

As is apparent from FIG. 2, the driving gates $\phi 1$ and $\phi 2$ present a capacitive load and include inter-phase and anti-ground capacitances. FIG. 3 shows an equivalent circuit including the capacitances $\phi 1$ and $\phi 2$ which result in problems in driving the CCD. In FIG. 3, reference character $C_{ov}$ designates an overlapping capacitance between the first and the second polycrystalline silicon electrodes 1 and 2. Reference character $C_{ox}$ designates a gate oxide film capacitance of the respective gate. Reference character CJ designates the capacitance of a transfer channel. From this equivalent circuit, the gate electrode capacitance C is represented by:

$$C = \left( C_{ov} + \frac{1}{\frac{1}{C_{ox}} + \frac{1}{CJ}} \right) \times N$$

where N is the number of CCD stages. This gate electrode capacitance is obtained when the driving gate $\phi 1$ or $\phi 2$ is at ground voltage.

The advancement of a highly integrated solidstate imaging device requires a high transfer speed. However, in a CCD including more than 10,000 stages, the driving circuit of the CCD is overloaded and it is difficult to transfer charges at high speed. In the CCD of the above-described construction, charge transfer is usually effected with a rectangular pulse. However, when the load is too large, the rectangular pulse is too weak. When the pulse power is increased, power dissipation is inevitably increased.

In order to solve these problems, a CCD is driven by a resonant circuit including an inductance and a capacitance, exploiting the capacitive load of the CCD.

FIG. 4(a) shows a CCD driving circuit utilizing a resonant circuit which was reported by Ito et al at page 79 of the 1987 National Meeting of the Society of Television Engineers. This driving circuit is quite effective for reducing power dissipation. In FIG. 4(a), reference numeral 7 designates a clock driver. Reference numeral 8 designates an equivalent capacitance $C(\phi 1 - \phi 2)$. Reference numeral 9 designates a dumping resistance R. Reference numeral 10 designates an inductance L. Reference numeral 11 designates a capacitance $C_S$. Reference numerals 12 and 13 designate clock inputs having inverted phases.

When the rectangular waves $f_1$ and $f_2$ shown in FIG. 4(b) are input to the clock drivers 7, the load viewed from the clock driver 7 is a resonant circuit having parallel and serial resonance frequencies $f_1$ and $f_2$ as shown in the following equations.

$$f_P = \frac{1}{2\pi \sqrt{L \cdot C_S \cdot C(\phi 1 - \phi 2)/(C_S + C(\phi 1 - \phi 2))}}$$

$$f_S = \frac{1}{2\pi \sqrt{L \cdot C_S}}$$

Therefore, when the circuit characteristics are optimized, sinusoidal waves shown by $\phi 1$ and $\phi 2$ of FIG. 4(c) are applied to the driving gate of the CCD. The charging and discharging energy of the equivalent capacitance $C(\phi 1 - \phi 2)$ is stored in the resonant circuit, and the power supplied from the external terminals $f_1$ and $f_2$ is reduced. However, there is a problem in that the equivalent capacitance of the CCD is not constant or it varies in accordance with the clock voltage applied to the gate and the amount of charge that is transferred; that is, as the capacitance of the transfer channel $C_j$ in FIG. 3 varies, the equivalent capacitance $C(\phi 1 - \phi 2)$ also varies. As a result, the resonant frequency inevitably varies.

SUMMARY OF THE INVENTION

It is an object of the present invention to provide a charge transfer device stably driven by a driver circuit incorporating a resonant circuit.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, alternate gaps between first electrodes are covered by second electrodes and the remaining gaps are covered by a third electrode which is continuous in the charge transfer direction. Alternate first electrodes are short-circuited to the second electrodes and receive the first clock phase signal, the remaining first electrodes are short-circuited to the third electrode and receive the second clock phase signal, and the overlapping areas of the first electrodes and the second electrodes in the different clock phases are larger than the overlapping areas of those electrodes receiving the same clock phase signal. The clock signals generated by a resonant circuit are applied to the first and second clock phases with a phase shift of 180 degrees between them. Thus, variations in the load capacitance due to the applied clock signal amplitudes and the transferred signal charges are reduced, whereby stable driving of a CCD with a driver circuit incorporating a resonant circuit is realized.

DETAILED DESCRIPTION OF THE PREFERRED EMBODIMENTS

Figure 1:
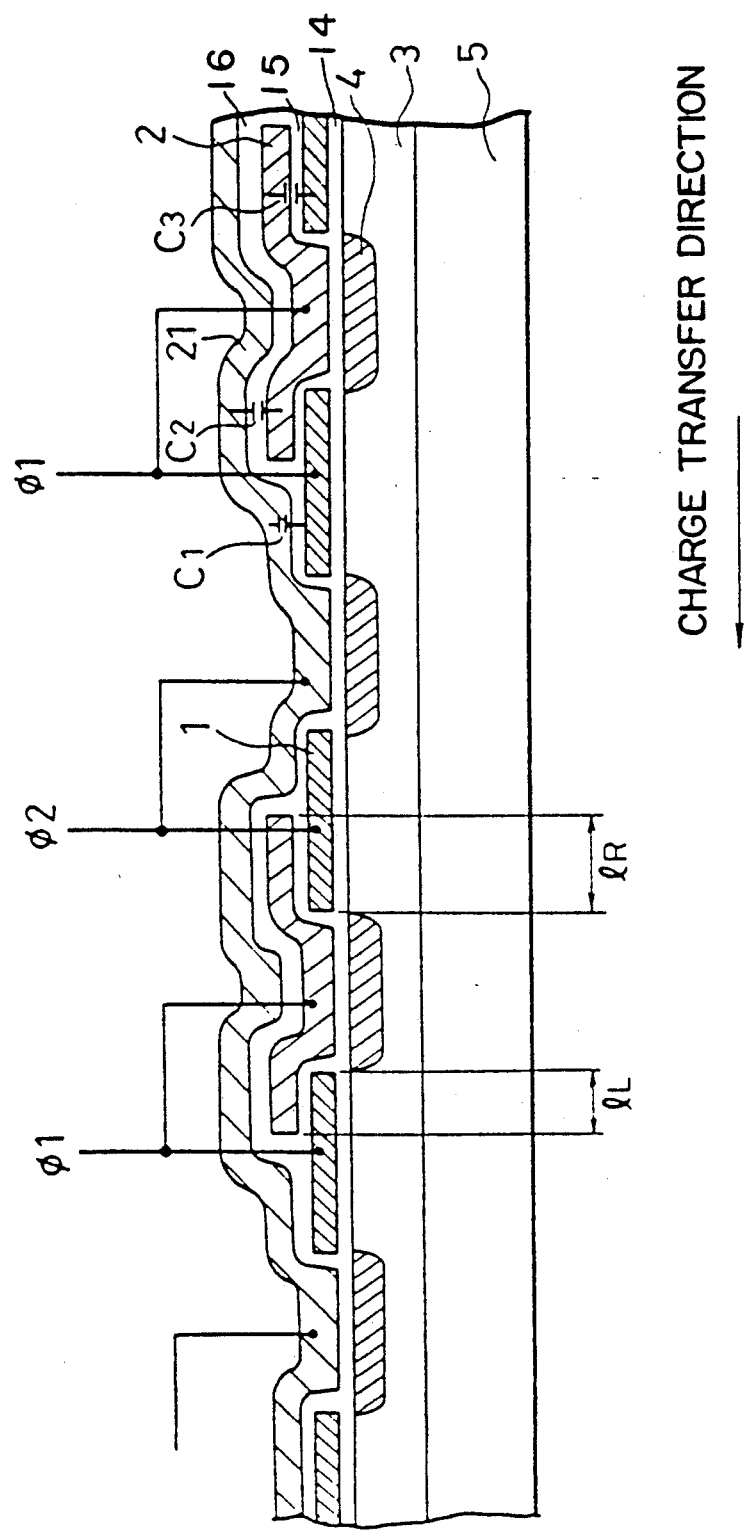
FIG. 1 is a cross-sectional view of a CCD according to an embodiment of the present invention.
Figure 2:
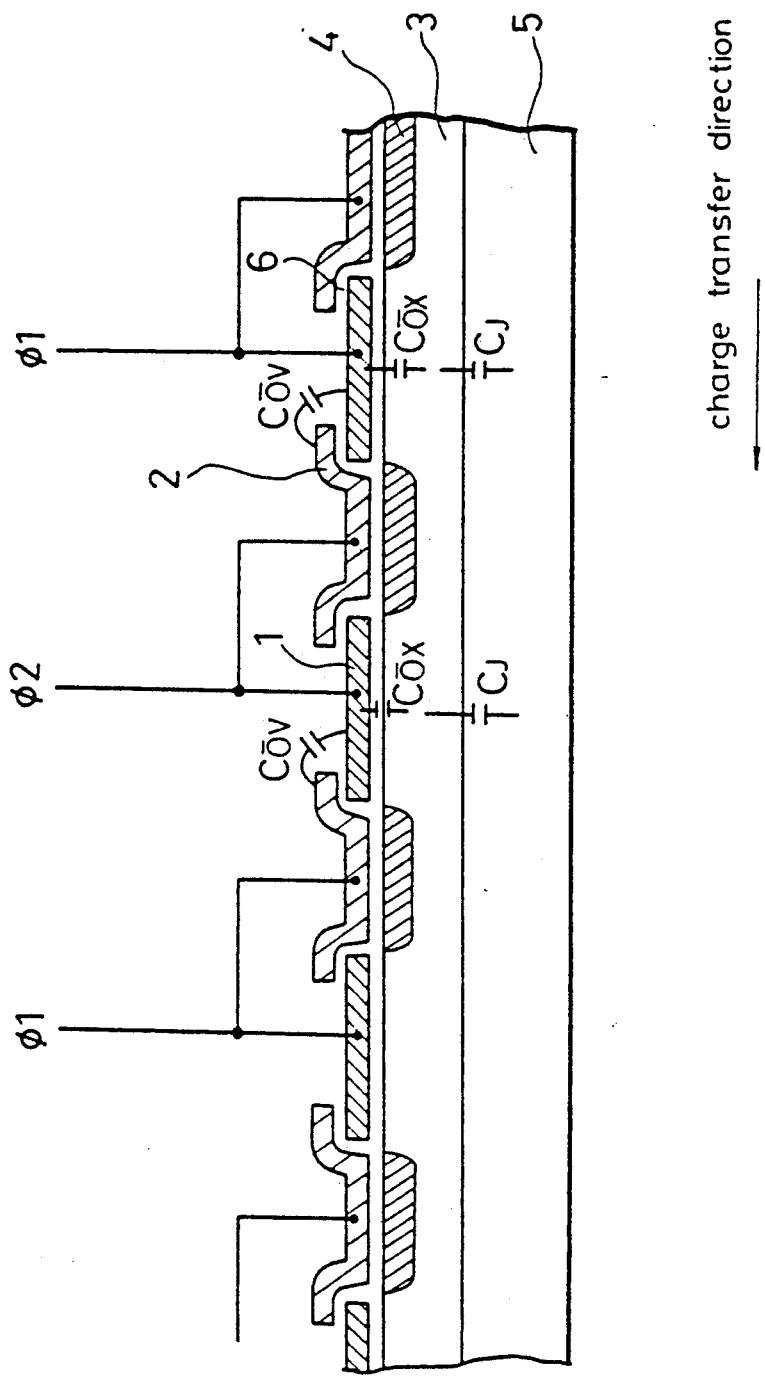
FIG. 2 is a cross-sectional view of a prior art CCD.
Figure 3:
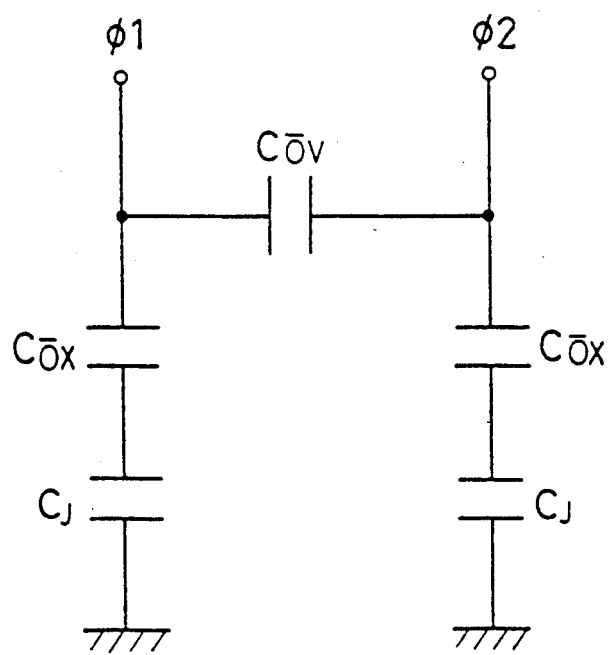
FIG. 3 is a diagram of an equivalent circuit of the load capacitance of a CCD.
Figure 4:
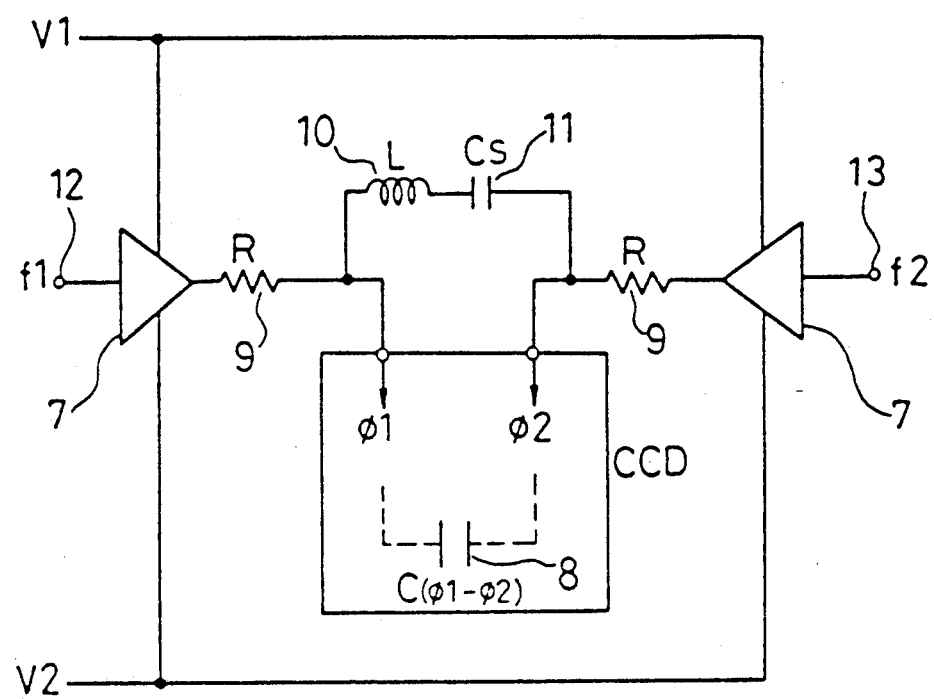
FIG. 4(a) is a diagram of a driving circuit of a CCD using a resonant circuit.
FIGS. 4(b) and 4(c) are clock driver and CCD gate driving waveforms, respectively, for the circuitry of FIG. 4(a).
Figure 4:
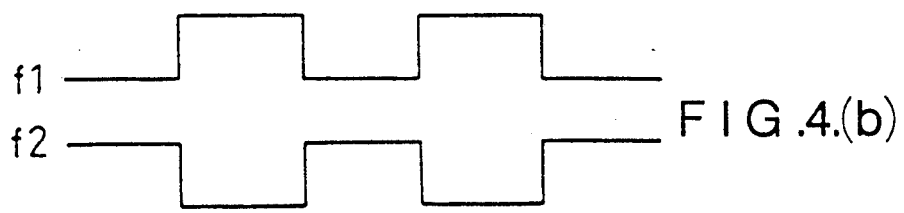
Figure 4:
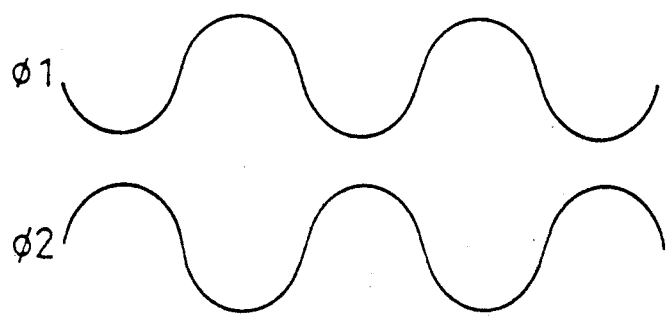

FIG. 1 is a cross-sectional view showing a charge transfer device according to an embodiment of the present invention. In FIG. 1, the same reference numerals designate the same elements as those shown in FIG. 2. Reference numeral 21 designates a third polycrystalline silicon electrode. In this embodiment, the second polycrystalline silicon electrodes 2 are disposed covering alternate gaps between the first polycrystalline silicon electrodes 1. The third polycrystalline silicon electrode 21 is continuous in the charge transfer direction. A first phase driving gate $\phi 1$ includes a first polycrystalline silicon electrode 1 electrically connected to the second polycrystalline silicon electrode 2 that is adjacent to and overlaps the electrode 1. A second phase driving gate $\phi 2$ includes a first polycrystalline silicon electrode 1 adjacent the first phase driving gate $\phi 1$ first electrode and electrically connected to the third polycrystalline silicon electrode 21. In this device, the clock signals generated by the resonant circuit comprising a capacitance component and an inductance component are supplied to the driving gates $\phi 1$ and $\phi 2$, respectively, with a phase shift between the clock signals of 180 degrees, thereby enabling charge transfer.

An n⁻-type layer 3 is grown on a p-type substrate 5, and the surface region of the n⁻-type layer 3 is oxidized to produce an oxide film 14 having a thickness of about 500 to 1000 angstroms. Polycrystalline silicon is deposited thereon to a thickness of about 4000 to 8000 angstroms and patterned to produce a plurality of polycrystalline silicon electrodes 1. An oxide film remains between the first electrodes 1 and layer 3. Next, the oxide film is etched using the first polycrystalline silicon electrodes 1 as a mask, and impurities are implanted into the N⁻ layer 3, thereby producing a plurality of p-type impurity channels 4 lying between and self-aligned with the first electrodes 1. Next, the entire surface is oxidized to produce a second oxide film 15 about 500 to 1000 angstroms in thickness. Polycrystalline silicon is deposited on the oxide layer to a thickness of about 4000 to 8000 angstroms and patterned to produce a plurality of second polycrystalline silicon electrodes 2. Second electrodes 2 are disposed opposite a corresponding channel 4 and overlap the adjacent first electrodes 1. Next, the second oxide film is etched using the second polycrystalline silicon electrodes 2 as a mask. A third oxide film 16 is then produced to a thickness of about 500 to 1000 angstroms on the entire surface. Thereafter, a third layer of polycrystalline silicon, i.e., electrode 21, of about 4000 to 8000 angstroms thickness is deposited on the third oxide film 16.

In the structure of this embodiment, the overlapping capacitance $C_{ov}$ between the driving gates $\phi 1$ and $\phi 2$ is represented by $$C_{ov} = C_1 + C_2 + C_3,$$

and the area of the overlapping portion is larger than that of the prior art device. In addition, $l_L$ represents an overlapping portion of the gate electrodes 1 and 2 in the first phase driving gate $\phi 1$ which produces an overlapping capacitance. However, this overlapping capacitance does not influence driving of the CCD because the overlapping portions of the gate electrodes 1 and 2 are the same phase, $\phi 1$. On the other hand, the overlapping portion represented by $l_R$, relating to $C_2$ and $C_3$, produces an overlapping capacitance between the phases $\phi 1$ and $\phi 2$. Therefore, the larger the overlapping portion $l_R$ is, the larger the overlapping capacitance $C_{ov}$ is.

When the overlapping capacitance is increased as described above, the equivalent capacitance between the first and second phase driving gates $\phi 1$ and $\phi 2$ is increased and the variations of junction capacitance due to variations of clock signal amplitude or transferred signal charges are not seen from the external circuit, whereby stable driving is realized.

While, in the above-illustrated embodiment, polycrystalline silicon is used as the CCD transfer electrode, other materials, such as tungsten silicide or titanium silicide, may be used.

While, in the above-illustrated embodiment, the second and third oxide films are thermal oxide films, films other than thermal oxide films, such as nitride films, may be used. When a nitride film is used, a dielectric constant of 7.5 is obtained which is twice as large as the dielectric constant of 3.9 of the thermal oxide film, whereby the inter-layer capacitance can be further increased.

While, in the above-illustrated embodiment, a buried channel CCD is described, a surface channel CCD in which a charge storage well is produced on the surface of the substrate and charges move at the surface may be used with the same effects.

As is evident from the foregoing description, according to the present invention, since the CCD is constructed such that a large inter-layer capacitance is produced, a driving circuit utilizing a resonant circuit can be stably used and a lower power dissipation can be accomplished.

What is claimed is:

1. A charge transfer device for transferring charge in a charge transfer direction comprising:
   a semiconductor substrate of a first conductivity type;
   a semiconductor layer of a second conductivity type opposite form the first conductivity type disposed on the substrate and including a surface;
   a plurality of spaced apart channels of the first conductivity type disposed in the layer at the surface;
   a first electrically insulating film disposed on the surface;
   a plurality of spaced apart first electrodes disposed on the first electrically insulating film, each first electrode lying between an adjacent pair of the channels;
   a second electrically insulating film disposed on the first electrodes and the surface;
   a plurality of spaced apart second electrodes disposed on the second electrically insulating film opposite respective alternating channels, electrically insulated from the first electrodes by the second electrically insulating film, and overlapping both of the first electrodes that are adjacent to the respective channel, the overlapping by each second electrode of an adjacent electrode that lies in a direction along which electrical charges are transferred by the charge transfer device covering a first area and the overlapping by each second electrode of an adjacent first electrode that lies opposite the direction along which electrical charges are transferred by the charge transfer device covering a second area, the second are being larger than the first area;

a third electrically insulating film disposed on the first and second electrodes and the second electrically insulating film; and a third electrode continuous in the direction along which electrical charges are transferred by the charge transfer device disposed on the third electrically insulating film opposite the alternating channels where no second electrode is disposed and opposite the first and second electrodes, wherein each second electrode is electrically connected to the adjacent first electrode that lies in the direction along which electrical charges are transferred by the charge transfer device as a first clock phase of the charge transfer device and each first electrode lying adjacent a second electrode opposite to the direction along which electrical charges are transferred by the charge transfer device is electrically connected to the third electrode as a second clock phase of the charge transfer device whereby the first and second clock phases are stably driven by first and second clock signals 180 degrees out of phase with each other produced by a clock driver including a resonant circuit.

2. The charge transfer device of claim 1 wherein at least one of the first, second, and third electrodes is polycrystalline silicon.

3. The charge transfer device of claim 1 wherein at least one of the first, second, and third electrodes is selected from the group consisting of tungsten silicide and titanium silicide.

4. The charge transfer device of claim 1 wherein at least one of the first, second, and third electrically insulating films is an oxide of silicon.

5. The charge transfer device of claim 1 wherein at least one of the first, second, and third electrically insulating films is silicon nitride.

* * * * *